United States Patent [19]
Maguire

[11] Patent Number: 5,617,348
[45] Date of Patent: Apr. 1, 1997

[54] LOW POWER DATA TRANSLATION CIRCUIT AND METHOD OF OPERATION

[75] Inventor: Jeffrey E. Maguire, Austin, Tex.

[73] Assignee: Motorola, Schaumburg, Ill.

[21] Appl. No.: 506,305

[22] Filed: Jul. 24, 1995

[51] Int. Cl.$^6$ ................................................. G11C 15/00
[52] U.S. Cl. ................ 365/49; 365/189.01; 365/230.01; 365/227
[58] Field of Search ................ 365/49, 227, 189.07, 365/189.01, 230.1, 233

[56] References Cited

U.S. PATENT DOCUMENTS

| | | | |
|---|---|---|---|
| 5,239,642 | 8/1993 | Gutierrez et al. | 365/49 |
| 5,280,449 | 1/1994 | Oldham | 365/189.02 |
| 5,329,629 | 7/1994 | Horst et al. | 365/49 |
| 5,564,052 | 10/1996 | Nguyen et al. | 365/49 |

*Primary Examiner*—David C. Nelms
*Assistant Examiner*—F. Niranjan

[57] ABSTRACT

A low power circuit (10) for translating logical addresses or input data to corresponding physical addresses or output data respectively. The circuit (10) includes an input latch (12), content addressable memory (CAM) (14), random access memory (RAM) (16), output latch (18), and comparator (20). The input latch (12) receives the logical address (22) and stores the logical address for at least one comparison cycle. The CAM (14) receives the logical address (22) and produces a corresponding match signal. The RAM (16) receives the corresponding match signal and produces the corresponding physical address (28). The output latch (18) receives the corresponding physical address (28) and stores the value for at least one clock cycle. The comparator (20) enables the CAM (14) and/or the RAM (16) operation only when the previous logical address does not match the current logical address (22). The corresponding physical address (28) remains in the output latch (18) until such time as a new logical address (22) or input data is provided to the low power circuit (10).

28 Claims, 4 Drawing Sheets

LOW POWER DATA TRANSLATION CIRCUIT AND METHOD OF OPERATION

TECHNICAL FIELD OF THE INVENTION

The present invention relates generally to data processing systems and more particularly to an apparatus for performing a reduced power data or address translation operation in a data processing system.

BACKGROUND OF THE INVENTION

Today's high performance data processing systems rely upon sophisticated memory management systems to translate logical addresses into real (physical) addresses. Logical addresses are the software addresses used by the programmer when writing software. Physical addresses are the hardware addresses used by the semiconductor chips and electronic circuitry running the software.

In a very simple microprocessor-based system, the central processing unit (CPU) is linked directly to memory. With this type of configuration, no memory mapping or task protection capabilities are provided, and the addresses generated by the CPU directly identify the physical locations to be accessed. This type of system, however, is unsuitable for multiple-task operations since there is no protection to prevent corruption of memory used by one task during execution of another.

A memory unit with one or more translation-lookaside buffers (TLBs) is often used to provide the address mapping and the task protection needed to construct a multi-tasking data processing system. The memory unit acts as an interface between the CPU and the physical memory. The memory unit controls all accesses to physical devices, and tasks can be prevented from accessing the memory resources used by other tasks. When under the control of an operating system with virtual memory capabilities, the logical-to-physical mapping functions allow tasks to utilize the entire address space of the CPU to build a memory system as large as the CPU address space without detailed knowledge of the physical characteristics of the system.

The logical address is generated by an instruction unit or a data unit of the CPU and is received as an input by the memory unit. The memory unit, using one or more TLBs, performs address translation and privilege checking for the logical address and, if the mapping is valid, drives the corresponding physical address to the data or instruction cache or some other type of memory. Note that the corresponding physical address produced by a TLB may be used to access either data or an instruction, depending upon whether the TLB is part of a data memory unit or part of an instruction memory unit.

Generally, a memory unit contains one or more TLBs which are used to perform address translation and privilege checking; the memory unit may also contain one or more cache memories which store actual data or instructions. Each entry in the TLB usually contains a logical address, a corresponding physical address, and one or more protection or control bits (collectively called attribute bits or attributes).

Typically, a TLB includes a content addressable memory portion (CAM), a random access memory portion (RAM), and associated control circuitry. The CAM is organized in a number of lines with each line capable of storing a logical address and each line including a corresponding match line. On each operation of the TLB, an incoming logical address is received by the TLB and compared to the logical addresses stored in the CAM. If the logical address matches a stored logical address, a translation "hit" (also called a "match") occurs, and the corresponding match line of the CAM produces a valid match signal.

Generally, each line of the CAM couples to a particular portion of the RAM and the enablement of a particular match line causes the RAM to produce a corresponding physical address. When the CAM does not contain the requisite logical address, a translation "miss" (also called "no match") occurs, and a hardware state machine or a software routing is invoked to search main memory in order to determine the physical address that corresponds to the received logical address. This search is often called a "table search" or a "table walk" because it may require the data processing system to access and read more than one memory table stored in MAIN memory.

The advantage of a TLB is that it saves a great deal of time. Rather than having to access tables in main memory every time a translation is required, the data processing system can quickly access the TLB and receive the correct physical address for certain selected logical addresses.

With the typical translation lookaside buffer, at each access of the TLB, charge is consumed by the CAM and by the RAM. During each operation of the CAM, every match line in the CAM is precharged and then discharged. Thus, significant charge is shunted to ground during each access or operation of the CAM. Further, during each operation of the TLB, the RAM is accessed. Because the bit lines and the inverted bit lines of the RAM are precharged prior to each access of the TLB, and one half of the bit line and inverted bit lines are discharged on each RAM access, significant charge is dissipated through the RAM during each operation. In many applications such as those applications run from batteries, any charge dissipation is undesirable. Therefore, certain techniques have been developed to reduce the power consumption of TLBs.

One particular prior art circuit for reducing the power consumption of a TLB or other types of memory is described in U.S. Pat. No. 5,280,449 assigned to ARM Research. The described circuit disables the RAM precharge when a logical address provided to the CAM matches a prior logical address that was received by the CAM. Upon a disablement of the RAM, the RAM continues to output the previously translated address. The disclosed precharge disablement technique described requires that the RAM sense amps be bypassed when the precharge is disabled in order to avoid power consumption. Thus, the precharge disablement technique requires bypass circuitry as well as multiplexing circuitry that selectively multiplexes RAM output and the sense amp output, both controlled by the precharge circuitry. The additional circuitry adds overhead, cost, and complexity. Further, the circuitry requires that the active match line of the CAM remain fixed during a memory access wherein the logical input does not change. Therefore, additional circuitry is required to hold the CAM in its prior state during such an operation. In addition to additional size and power consumption, precharge disablement requires the circuit to be precharged and accessed when a different logical address is presented to the CAM. As is well known in the art, it is desireable to maintain small precharge device sizes to minimimize loading and circuit space. This results in choosing between slow precharge operation or larger device sizes to allow for a faster precharge time to imprve performance.

since the precharge is normally slow to allow for to minimize precharge device loading in the circuit.

Thus, there exists a need in the art for an improved fast access translation circuit with minimized power consumption.

DETAILED DESCRIPTION OF A PREFERRED EMBODIMENT

The present invention includes an apparatus and method for translating logical addresses or input data to corresponding physical addresses or output data respectively. The translation-lookaside buffer (TLB) 10 circuit includes an input latch, content addressable memory (CAM), random access memory (RAM), output latch, and comparator. The input latch receives the logical address and stores the logical address for at least one comparison cycle. The CAM receives the logical address and produces a corresponding match signal based on the logical address. The RAM receives the corresponding match signal and produces a corresponding physical address based upon the logical address. The CAM and the RAM preferably operate only when they receive the enable signal. The output latch receives the corresponding physical address from the RAM and stores the value for at least one clock cycle. The comparator asserts the enable signal only when the logical address does not match the contents of the latch. Therefore, the selective enablement of the CAM and the RAM reduces the charge dissipation of the circuitry. Because an output buffer is generally required to drive the physical address, additional circuitry requirements to latch the output data are minimal, and will not affect the performance of the TLB.

Figure 1:
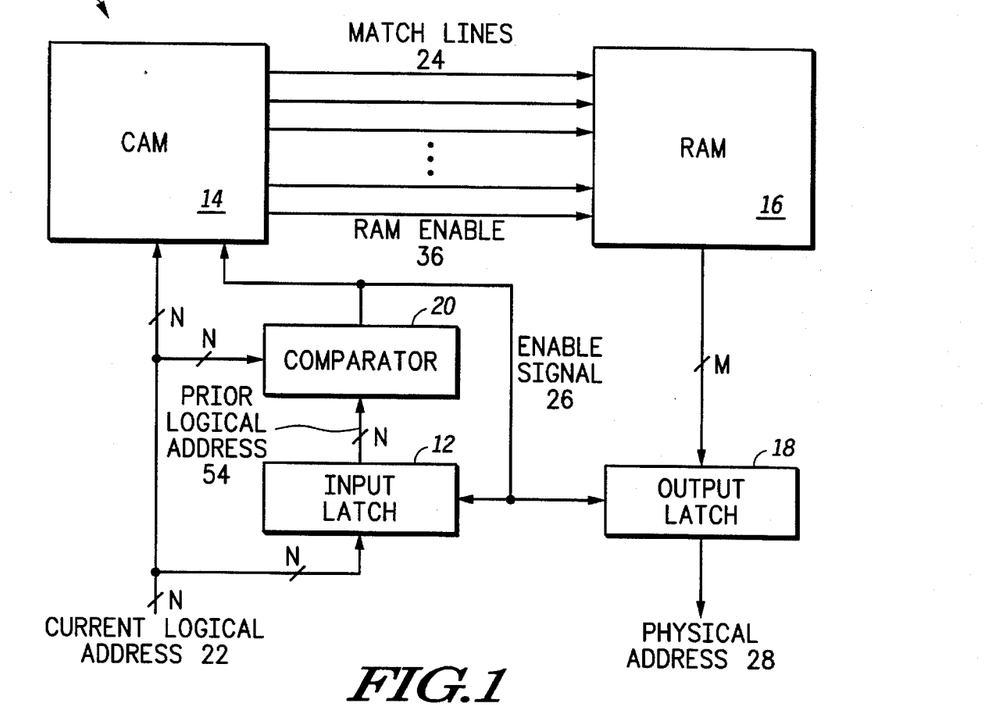
FIG. 1 illustrates a block diagram of a low power circuit for translating a logical address to corresponding physical address in accordance with the present invention.

FIG. 1 illustrates a low power TLB circuit 10 for translating a logical address 22 to a corresponding physical address 28. The TLB circuit 10 comprises an input latch 12, content addressable memory (CAM) 14, random access memory (RAM) 16, output latch 18, and a comparator 20. As one skilled in the art will readily appreciate, the TLB circuit 10 could be used in any data translation application, and the use of the TLB circuit 10 is not limited to the translation of addresses in conjunction with memory accesses.

The input latch 12 receives the current logical address 22 via a data path having a width of N bits. The current logical address 22 may correspond to a portion of an address produced by a software program such that the TLB circuit 10 translates a portion of the logical address to generate the physical address of a page of memory. The input latch 12 preferably latches the current logical address 22 for a single access cycle, and, in order to avoid power consumption, only latches the current logical address 22 when it differs from the previously latched contents. This is controlled by the enabling circuitry, which generates enable signal 26. Preferably, the input latch 12 comprises any of a variety of latches as are known in that art that are capable of latching input data. Therefore, the operation of the input latch 12 is not further described.

Figure 2:
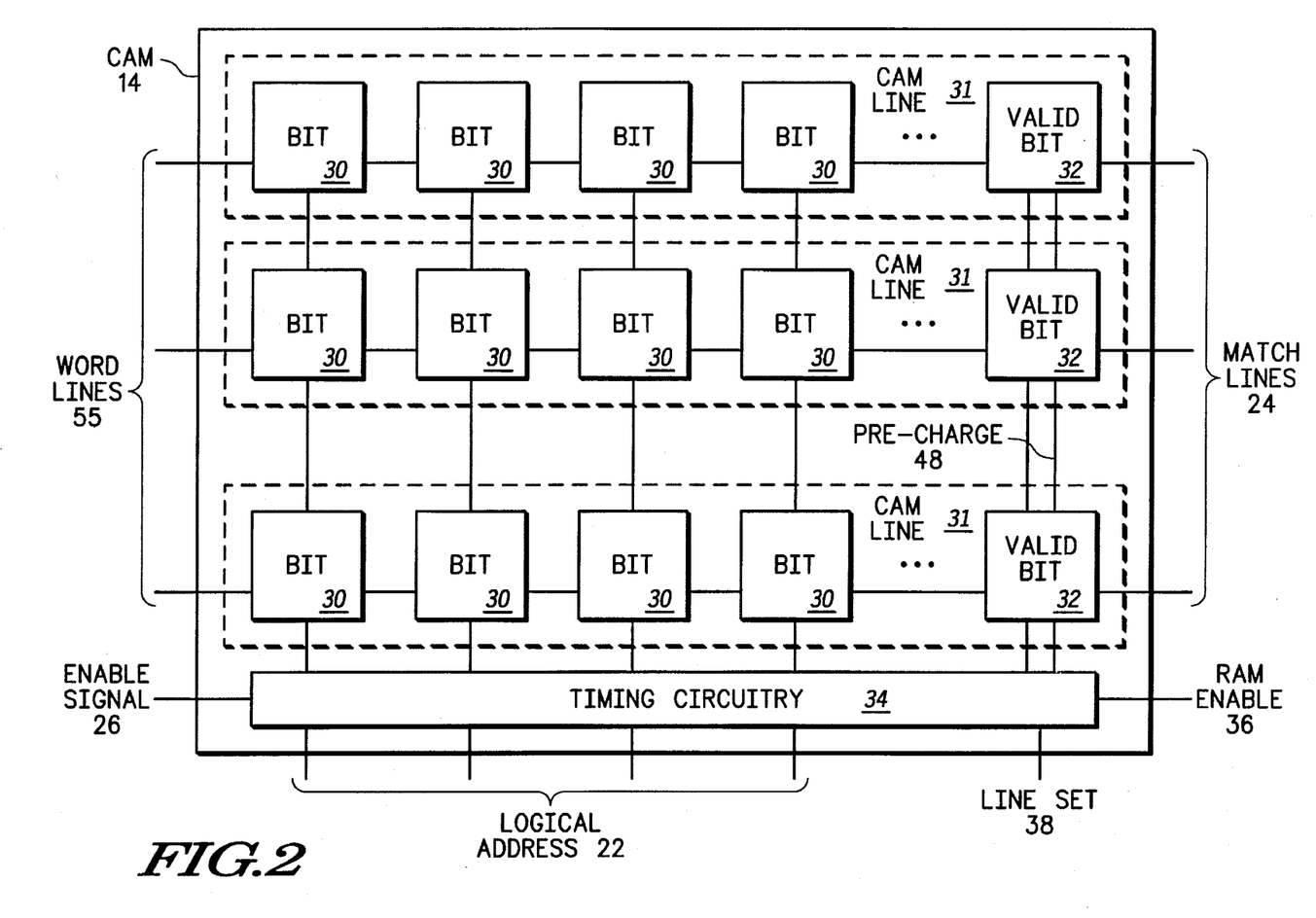
FIG. 2 illustrates a block diagram of a content addressable memory (CAM) in accordance with the present invention.

The CAM 14 receives the current logical address 22 and produces corresponding match lines 24 based on the current logical address 22. Each of the match lines 24 corresponds to only one CAM line 31, as shown in FIG. 2, with a respective match line 24 being enabled upon a "hit" of the respective CAM line 31 during a CAM 14 access. A CAM line 31 is a plurality of CAM bit circuits arranged to store data representing a logical address. The plurality of match lines 24 provide input to the RAM 16, with each of the match lines 24 relating to a specific location within the RAM 16.

In the preferred embodiment, RAM 16 is enabled by the CAM 14 and stores a plurality of physical addresses. Preferably, the RAM 16 is of a standard construction known in the art with each match line 24 serving as a word line that causes a selected line of the RAM 16 to be accessed. Upon receipt of a RAM enable signal 36 and an active match line signal 24, the RAM 16 produces a physical address 28 corresponding to the matched line value of the CAM 14. In accordance with the present invention, the RAM enable signal 36 will be produced only when a CAM access has been enable with enable signal 26. Thus, by selectively enabling the RAM 16, power consumption of the RAM 16 is reduced.

The output latch 18 operably couples to the RAM 16 and latches the corresponding physical address 28 when produced by the RAM 16. Preferably, the output latch 18 latches the corresponding physical address based upon the enable signal 26 so that the output latch 18 retains the data produced by the RAM 16 on the last valid RAM 16 access. Preferably, the output latch 18 is of a construction known in the art.

When the RAM 16 receives the RAM enable signal 36, the new physical address 28 produced by the RAM 16 will be latched within the output latch 18. This is accomplished with enable signal 26. However, when the RAM enable signal 36 is not received by the RAM, the output latch 18 retains the previously latched physical address 28. Thus, the physical address 28 contained within the output latch 18 will be secure for those access operations of low power circuit when the RAM 16 is not enabled.

Comparator 20 operably couples to the input latch 12, the CAM 14, the RAM 16, and the output latch 18. The comparator 20 receives the current logical address 22 and the prior logical address 54. The prior logical address 54 is the latched contents latched during prior operation. The prior logical address 54 during any operation of the TLB circuit 10 will have been previously latched in the input latch 12 and provided to the comparator by the input latch 12. The comparator then compares the current logical address 22 with the prior logical address 54 and produces the enable signal 26 only when the current logical address 22 is not the same as the prior logical address 54.

When an operation of the TLB circuit 10 includes a current logical address 22 which is the same as the prior logical address 54 latched in the input latch 12, the comparator 20 will not provide the enable signal 26. Therefore, the operation of the RAM 16, and CAM 14 is prohibited. In this case, the output latch 18 provides the physical address 28 that had previously been latched in the output latch 18.

Because the current logical address 22 provided to the CAM 14 corresponds to the physical address 28 stored in the output latch 18, the TLB circuit 10 functions correctly even though the CAM 14 and the RAM 16 have not been accessed.

As one skilled in the art will readily appreciate, during many TLB operations will issue a current logical address 22 that is equal to the prior logical address 54. In these cases, an identical physical address 28 would be produced by the RAM 16. However, in these situations, it is not necessary to perform either a CAM 14 operation or a RAM 16 operation. Therefore, the TLB circuit 10 of the present invention prevents the CAM 14 from operating during such an access to reduce the power consumption by the buffer. As one skilled in the art will readily appreciate, the operation of the TLB circuit 10 of the present invention reduces the power consumption of both the RAM 16 and the CAM 14. The reduction in the power consumption of the respective circuitry provides the important benefit of extending battery life in those circuits which are powered by batteries. Further, by reducing power consumption, heat production is also reduced, extending the life expectancy of the circuitry.

FIG. 2 illustrates a typical construction of the CAM 14 operating in accordance with the principle of the present invention. The CAM 14 preferably comprises a plurality of CAM bit circuits 30, a plurality of valid bit circuits 32, and timing circuitry 34 which produces a RAM enable signal 36. The CAM 14 comprises a plurality of CAM lines 31, each comprising a plurality of CAM bit circuits 30, and at least one valid bit circuit 32. The CAM 14 receives logical addresses which are passed to each CAM line 31 of the CAM 14. The valid bit circuits 32 are activated by a line set signal 38 to enable the operation of the particular CAM line 31 of the CAM 14.

The CAM 14 is programmed such that a particular logical address resides in each of the CAM lines 31 of the CAM 14. The particular logical address is selectively programmed into the line via the CAM bit circuits 30. As is known in the art, each CAM line 31 may be programmed using the current logical address 22 and word lines 55 (row enablement circuitry) that enable the particular CAM line 31. The details of programming in the CAM 14 are not further described herein as they are known in the art. The valid bit circuitry 32 associated with each line of the CAM 14 enables the respective CAM line 31 to be compared with the current logical address 22. If the valid bit circuitry 32 is not activated, the particular CAM line 31 will not be enabled so as to compare its contents to a current logical address 22 input into the CAM.

In an operation of the CAM 14, a current logical address 22 is provided to the CAM 14. The bits associated with the current logical address 22 are provided to each CAM line 31 for comparison. A match line 24 associated with each CAM line 31, that has been activated by setting the corresponding valid bit circuit 32, is precharged to a logic high level. If the current logical address 22 does not compare favorably to the contents of a CAM line 31, the match line 24 for that particular CAM line 31 will be pulled to an inactive or deasserted state. However, if the logical address 22 compares favorably to the contents of a CAM line 31, the match line 24 of the corresponding CAM line 31 remains active or asserted. For the embodiment described, a successful compare is denoted by a logic level one, this state can also be referred to as asserted, active or high. As one skilled in the art will readily appreciate, it is assumed that no two CAM lines 31 are programmed with the same logical address. Thus, for a particular logical address input to the CAM 14, if a hit occurs, only a single match line 24 will remain active or asserted logic high after an access to the CAM 14.

The timing circuitry 34 receives the enable signal 26 and produces a match line valid signal or RAM enable signal 36 only after the CAM 14 has had sufficient time to generate a valid match line 24. Therefore, The RAM enable signal 36 can be used for timing purposes to enable the RAM 16 access. This is accomplished by activating the RAM enable 36 only if the enable signal 26 is valid and the CAM 14 has had sufficient time to perform a comparison. In the preferred embodiment, a dummy CAM line is used to propagate the enable signal 26 to assure sufficient time to perform the comparison has elapsed. This enable is also used to enable the RAM operation. If enable signal 26 never asserts, the timing circuitry will not assert the RAM enable signal.

Figure 3:
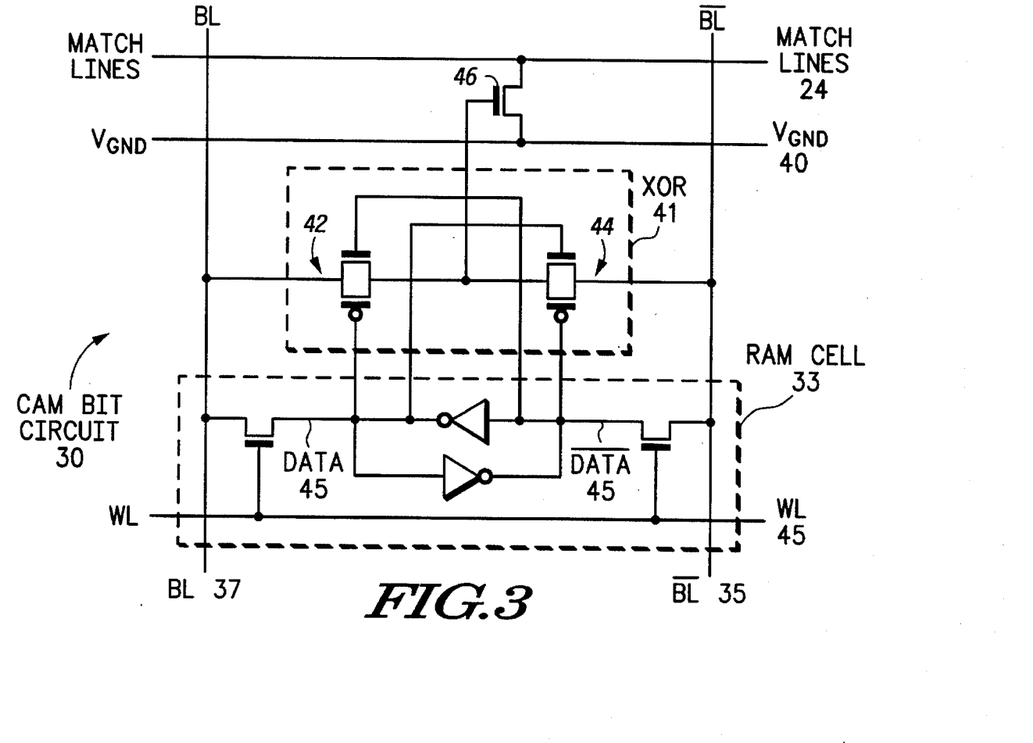
FIG. 3 illustrates a schematic diagram of a CAM bit circuit in accordance with the present invention.

FIG. 3 illustrates a typical CAM bit circuit 30 contained within the CAM 14. As one skilled in the art will readily appreciate, the CAM bit circuit 30 includes a typical RAM cell 33 that is used to store a bit of data for comparison purposes. Each bit of the logical address comprises a data bit 43 and an inverted data bit 45. The data bit 43 and inverted data bit 45 are written into the RAM cell 33 via a bit line 37 and an inverted bit line 35 when word line 95 is enabled. In this fashion, each of the CAM bit circuits 30 of the CAM 14 may be programmed with a selected logical address 22.

During an access, an exclusive OR (XOR) circuit 41 compares the bit line 37 and inverted bit line 35 to a bit of the data 43 programmed in the CAM 14 line. While the XOR circuitry 41 may be implemented in various ways, the particular circuitry of CAM bit circuit 30 includes a first transmission-gate 42 and a second transmission-gate 44 operably coupled to the RAM cell 33 to perform a comparison of the data 43 in the CAM bit circuit 30 to the value of the bit line 37 and the inverted bit line 35.

In the embodiment shown, match line 24 is precharged to a logic high level prior to an access to the CAM 14. The match line 24 connects to each CAM bit circuit 30 of the respective row or CAM line 31. When the contents of the RAM cell 33 do not match to the contents of the bit line 37 and the inverted bit line 35, an N-channel transistor 46 pulls the respective match line 24 down to the level of the virtual ground connection, $V_{gnd}$ line 40. Thus, during an access wherein a CAM line 31 includes any bit that does not match the current logical address 22, the CAM bit circuit 30 associated with a non-matching bit will pull match line 24 down to the $V_{gnd}$ line 40 level. In this fashion, the only CAM line 31 that will not be pulled down to the $V_{gnd}$ line 40 level will be that CAM line 31 whose data value matches exactly the current logical address 22.

Figure 4:
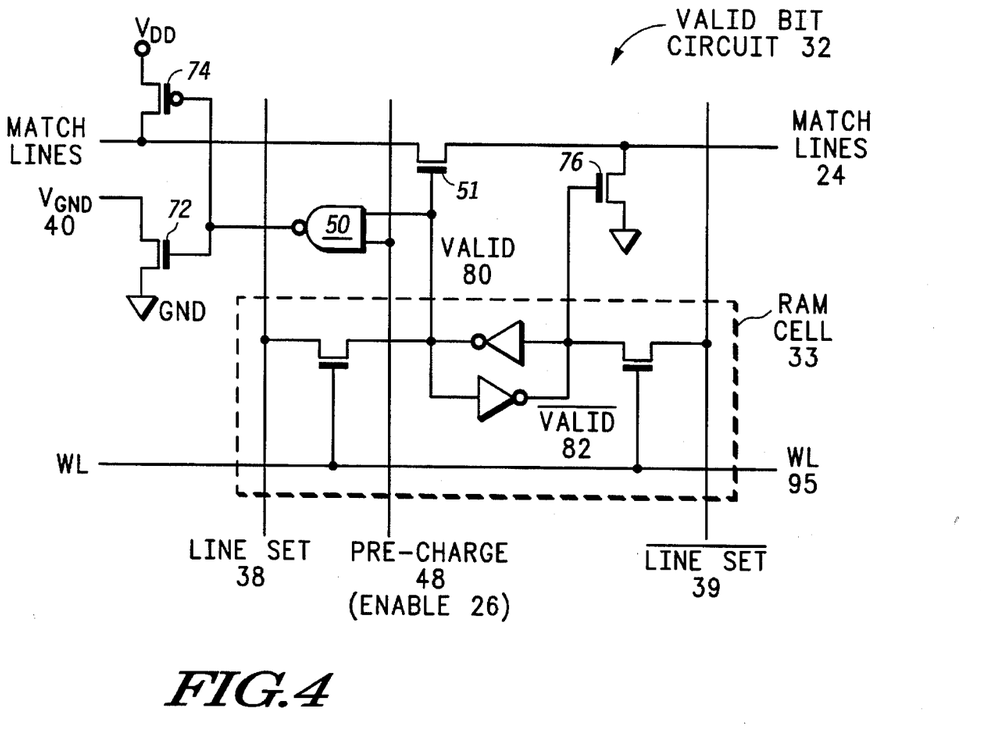
FIG. 4 illustrates a schematic diagram of a valid bit circuit of the CAM in accordance with the present invention.

FIG. 4 illustrates a valid bit circuit 32 in accordance with the CAM 14 of the present invention. Preferably the valid bit circuit 32 includes a RAM cell 33 and additional circuitry. The RAM cell 33 is a typical RAM cell as known in the art and can be loaded with data such that the data represents that the valid bit circuit 32 has been validated for the particular line in the CAM 14. In the RAM cell 33 shown in FIG. 4, the VALID node 80 must be driven active high level for the particular valid bit circuit 32 to enable a precharge of the match line 24 in the CAM 14. The RAM cell 33 may be set valid using line set 38, inverted line set 39, and word line 95. The enablement of RAM cell 33 is known in the art.

The valid bit circuit 32 operates to precharge the match line 24 of particular line of the CAM 14 only when the valid bit circuit 32 has been validated and a precharge signal 48 has been received. The precharge signal 48 is generated by tthe comparator 20 upon a favorable compare, and in the present embodiment is substantially equal to the enable signal 26. NAND gate 50 receives the VALID node signal 80, which is the RAM cell 33 contents, and the precharge signal 48. When both the precharge signal 48 and the VALID node signal 80 are logic high, the match line 24 of an associated CAM line 31 will be pulled to voltage $V_{DD}$ via a P-channel transistor 74, and therefore, the match line 24 will be precharged. When the precharge signal transitions low, when comparator 20 mismatches, the output of the NAND gate 50 goes logic high, the N-channel transistor 72 associated with the output of the NAND gate 50 pulls node $V_{gnd}$ 40 to a reference ground level GND. In this manner, the CAM 14 is in precharge waiting for comparator 20 to mismatch. Once a mismatch occurs, the CAM is able to response quickly because it is already precharged.

As one skilled in the art will readily appreciate, precharge line 48 passes through each of the valid bit circuits 32 of the CAM 14. When the precharge line 48 goes active high, only those match lines 24 associated with validated lines of the CAM 14 will be precharged to bring the associated match line 24 to a logic high level. This causes the valid bit circuit 32 of the CAM 14 in the present invention to reduce power consumption by preventing a precharge of the particular line of the CAM 14 if the line has not been validated. Accordingly, when the RAM cell 33 has not been validated for the particular valid bit circuit 32, the associated match line 24 in the CAM 14 is never precharged during the precharge cycle of the CAM 14.

In order to precharge the match lines, the matching operation must first be disabled. Prior art teaches that the match function may be disabled by pulling the bit lines 37 and the inverted bit lines 35 low. This causes an excessive amount of charge to be discharged each cycle, since either the bit lines 37 or the inverted bit lines 35 will always be at a high potential after a CAM access cycle. This causes excessive power usage when either bit line 37 or inverted bit line 35 is discharged after each CAM access. The present invention eliminates this problem by using a signal Vgnd 40. Vgnd is connected to the match line 24 through transistor 46, in FIG. 3, and to GND through transistor 72 in FIG. 4. The transistor 72 is off whenever the match line 24 is being precharged. This configuration allows the Vgnd signal to float while precharging the match line 24 is occurring. As a result, it does not matter what the values are on the bit line 77 or the inverted bit line 75, because even if their values cause a match to occur, there no longer is a ground reference available on $V_{gnd}$ to pull the match lines 24 low. Therefore, both the bit lines 77 and the inverted bit lines 75 may be statically driven, hence reducing power.

Figure 5:
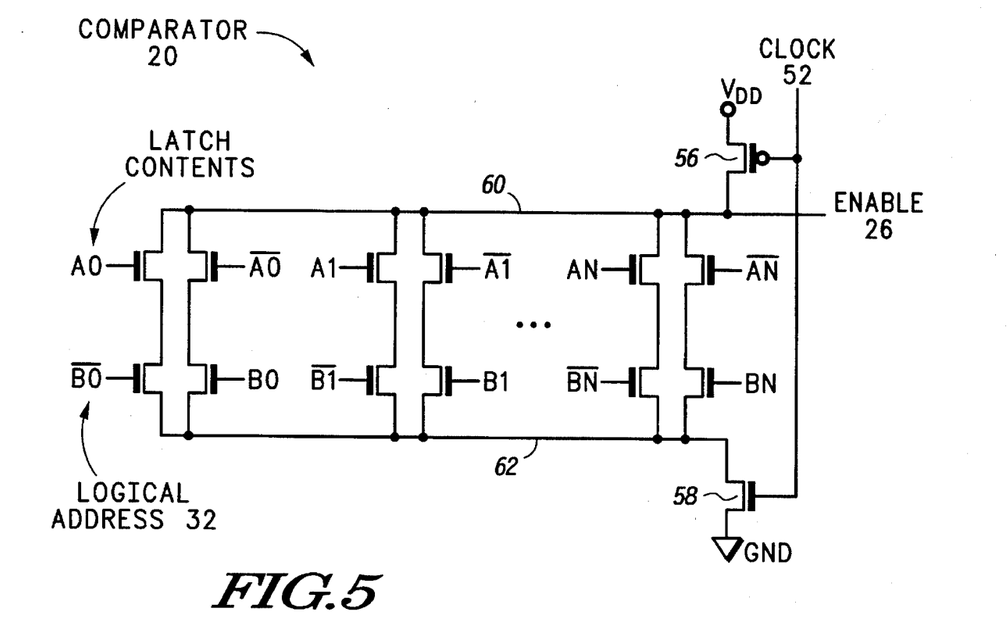
FIG. 5 illustrates a schematic diagram of a comparator used with the low power circuitry of the present invention.

FIG. 5 illustrates the comparator 20 constructed in a preferred manner in accordance with the low power circuitry 10 of the present invention. The comparator 20 serves to compare the current logical address 22 applied to the CAM 14 with the contents of the input latch 12. Preferably, the comparator 20 comprises a plurality of parallel connected exclusive-OR (XOR) gates that pull an enable signal 26 logic low if any bits of the current logical address 22 do not match any bits contained in the prior logical address 54 stored in the input latch. Clock signal 52 precharges the comparator 20 during a first phase of the clock and allows a comparison of the prior logical address 54 and the current logical address 22 during a second phase of the clock 52.

During the first phase of the clock 52, P-channel transistor 56 is turned on while N-channel transistor 58 is turned off to allow the P-channel transistor 56 to pull up a first side 60 of the comparator 20 to $V_{DD}$. The first side 60 of the comparator 20 associates with the enable signal 26. During a second phase of the clock 52, P-channel transistor 56 is turned off while N-channel transistor 58 is turned on to allow the N-channel transistor 58 to pull the second side 62 of the comparator 20 to GND. The second side 62 of the comparator 20 also acts as a virtual ground during a first phase of the clock 52 so that the first side 60 of the comparator 20 may be precharged to the $V_{DD}$ level. As one skilled in the art will readily appreciate, when the current logical address 22 does not match the prior logical address 54 exactly, at least one of the legs of the comparator 20 will conduct to pull the first side 60 of the comparator 20 to the same voltage as the second side 62 of the comparator 20. In such a situation, the enable signal 26 is pulled to ground level, indicating an unfavorable comparison occurred, and to begin the TLB access.

The TLB circuit 10 of the present invention reduces the energy consumption of both the CAM 14 and the RAM 16 by locking the circuit in precharge during those operations where the current logical address 22 is identical to the prior logical address 54. As one skilled in the art will readily appreciate, the logical address 22 used by the TLB circuit 10 will typically comprise only the portion of a full logical address used by a software program. Such is the case because typically the TLB circuit 10 in the present invention produces a page address corresponding to a physical location in RAM 16. In such a situation, the successive memory accesses of the same page are common. Therefore, in those situations, the operation of the TLB circuit 10 provides significant power reductions.

The low power circuitry 10 of the present invention is not limited to the translation of a logical address 22 to a physical address 28. The TLB circuit 10 could also be employed to translate instructions, associative data, or other data that may be used by a data processing system.

Figure 6:
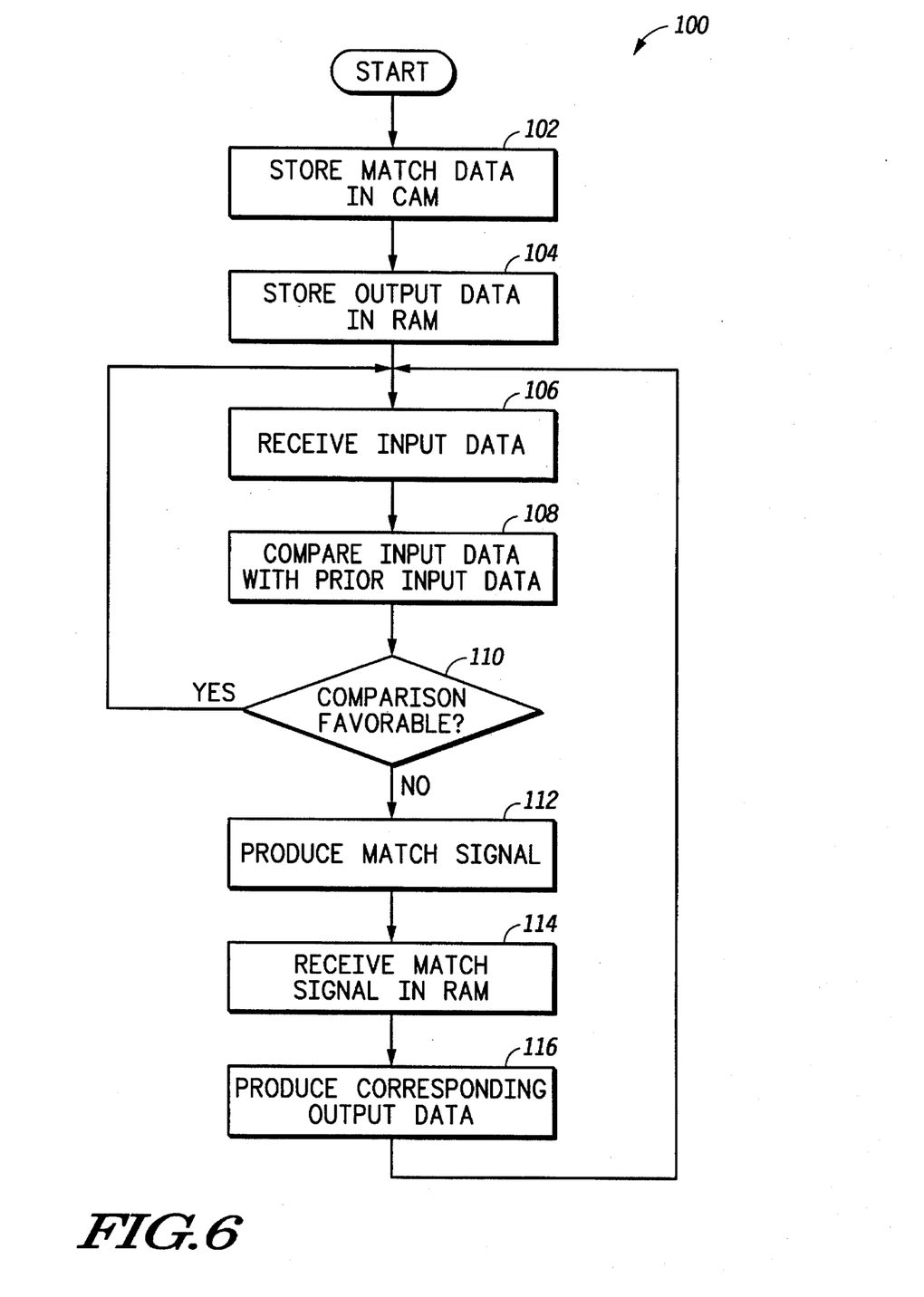
FIG. 6 illustrates a flow diagram of a method for translating input data to corresponding output data in accordance with the present invention.

FIG. 6 illustrates a method 100 for translating input data to corresponding output data. The method includes block 102 a first step of storing matching data in a content addressable memory (CAM). As one skilled in the art will readily appreciate, storing matching data in a CAM would preferably comprise actually programming the CAM to produce a particular match signal upon receipt of particular input data. Next, at step 104 the method includes storing output data in a random access memory (RAM) corresponding to the input data stored in the CAM. The storage of matching data within the CAM and the output data within a RAM could be performed simultaneously so as to minimize the complexity of the steps involved.

Next, at step 106 the method includes receiving input data. The input data could be simply data that would be translated or could be a logical address that would be received in the expectation that a corresponding physical address would be produced. Next, at step 108 the method includes comparing the input data with prior input data. Comparison would typically be performed by a comparator with a resultant produced based upon the comparison. Next, step 110 of the method includes determining whether the comparison performed in step 108 was favorable (i.e. a match). If the comparison was favorable the method returns to step 106, wherein further input data is received. However, if at step 110 the comparison is not favorable (i.e. no match) the method proceeds to step 112, where a match signal is produced. The match signal is based upon the input data received. Next, at step 114, the method includes receiving a match signal in RAM, the match signal based upon the input data received. Next, at step 116 the method includes producing corresponding output data from the RAM based upon the match signal received. The corresponding output data relates directly to the input data received and has physical significance to the circuitry employing the method of the present invention. From step 116 the method returns to step 106 wherein additional input data is received.

The above described preferred embodiments are intended to illustrate the principles of the invention, but not to limit the scope of the invention. Various other embodiments and modifications to these preferred embodiments may be made by those skilled in the art without departing from the scope of the following claims.

I claim:

1. A low power circuit for translating a logical address to a corresponding physical address, the low power circuit comprising:

an input latch for receiving a logical address;

a content addressable memory (CAM), for receiving the logical address and producing a corresponding match signal when the logical address matches an entry stored in the CAM;

a random access memory operably coupled to the content addressable memory, the random access memory stores a plurality of physical adresses, and upon receipt of an enable signal and the corresponding match signal, the random access memory produces a corresponding physical address;

an output latch operable coupled to the random access memory, wherein the output latch stores the corresponding physical address; and a comparator operably coupled to the input latch, the content addressable memory, and the random access memory, the comparator receives the logical address, and a prior logical address, wherein the comparator compares the logical address with the prior logical address, and the comparator asserts the enable signal when the logical address does not match the prior logical address, wherein the random access memory is maintained in a low power consumption state if the enable signal is de-asserted.

2. The low power circuit of claim 1, wherein the comparator further comprises a content addressable memory enabling circuitry, for enabling the content addressable memory to produce a corresponding match signal only when the logical address does not match the prior logical address.

3. The low power circuit of claim 2, wherein the content addressable memory enabling circuitry is used to determine when a precharge signal for the content addressable memory should be generated.

4. The low power circuit of claim 1, wherein the content addressable memory further includes row enablement circuitry, and wherein the row enablement circuitry precharges a match line of a respective row of the content addressable memory only if the row enablement circuitry has been activated for the respective row.

5. The low power circuit of claim 4, wherein the virtual ground enablement circuitry allows the CAM to be statically driven.

6. The low power circuit of claim 5, wherein the row enablement circuitry further comprises a virtual ground connection; the virtual ground connection precludes a discharge of the match line during a precharge cycle of the match line.

7. The low power circuit of claim 1, wherein the random access memory further comprises charge control circuit; the charge control circuit maintains the random access memory in a precharge state until receipt of the enable signal.

8. The low power circuit of claim 1, further comprising input latch update circuitry operably coupled to the input latch and the comparator, wherein the input latch update circuitry causes the input latch to store the prior logical address only when the comparison between the logical address and the prior logical address is unfavorable.

9. The low power circuit of claim 1, wherein the comparator and the output latch are operably coupled, the output latch storing the corresponding physical address upon receipt of the enable signal.

10. A low power circuit for translating input data to corresponding output data, the low power circuit comprising:

an input latch for receiving input data;

a content addressable memory (CAM), wherein the content addressable memory receives the input data, and wherein the content addressable memroy produces a corresponding match signal based on the input data;

a random access memory operably coupled to the content addressable memory; wherein he random access memory stores output data, and upon receipt of an enable signal and the corresponding match signal, the random access memory produces a corresponding output data; and a comparator operably coupled to the input latch, the content addressable memory, and the random access memory, the comparator receives the input data and a prior input data, the comparator compares the input data with the prior input data, and asserts the enable signal only when the input data does not match the prior input data, wherein the random access memory, is maintained in a low power consumption state if the enable signal is de-asserted.

11. The low power circuit of claim 10, wherein the comparator further comprises content addressable memory enabling circuitry, for enabling the content addressable memory to produce a corresponding match signal only when the input data compares unfavorably with the prior input data.

12. The low power circuit of claim 11, wherein the content addressable memory enabling circuitry is used for determining when a precharge signal for the content addressable memory should be generated.

13. The low power circuit of claim 10, wherein the content addressable memory further includes row enablement circuitry, and the row enablement circuitry precharges a match line of a respective row of the content addressable memory only if the row enablement circuitry has been activated for the respective row.

14. The low power circuit of claim 13, wherein the row enablement circuitry further comprises a virtual ground connection; the virtual ground connection precludes a discharge of the match line during a precharge cycle of the match line.

15. The low power circuit of claim 14, wherein the virtual ground enablement circuitry allows the CAM to be statically driven.

16. The low power circuit of claim 10, wherein the random access memory further comprises charge control circuitry; the charge control circuitry maintains the random access memory in a precharge state until receipt of the enable signal.

17. The low power circuit of claim 10, further comprising input latch update circuitry operably coupled to the input latch and the comparator, wherein the input latch update circuitry causes the input latch to store the prior input data only when the comparison between the input data and the prior input data is unfavorable.

18. The low power circuit of claim 10, wherein the comparator and the output latch are operably coupled to store the corresponding output data upon receipt of the enable signal.

19. A method for translating a logical address to a corresponding physical address, the method comprising the steps of:

(a) storing a plurality of physical addresses in a random access memory;

(b) receiving a logical address;

(c) producing a corresponding match signal based on the logical address;

(d) receiving the corresponding match signal in the random access memory;

(e) comparing the logical address with a prior logical address;

(f) when the logical address does not match the prior logical address, enabling the random access memory to produce a corresponding physical address based on the corresponding match signal; and (g) when the logical address matches the prior logical address, maintaining the random access memory in a precharge state.

20. The method of claim 19, wherein step (c) includes the step of producing the corresponding match signal when the logical address compares unfavorably with the prior logical address.

21. A method for translating input data to corresponding output data, the method comprising the steps of:

(a) storing input data in a random access memory;

(b) receiving input data;

(c) producing a corresponding match signal based on the input data;

(d) receiving the corresponding match signal in the random access memory;

(e) comparing the input data with prior input data;

(f) when the input data compares unfavorably with the prior input data, enabling the random access memory to produce corresponding output data based on the corresponding match signal; and (g) when the input data matches the prior input data, maintaining the random access memory in a precharge state.

22. The method of claim 21 wherein step (c) includes the step of producing the corresponding match signal when the input data compares unfavorably with the prior input data.

23. A translation circuit for translating a first address to a corresponding second address, the translation circuit comprising a content addressable memory (CAM) having a CAM line, the CAM line for storing a CAM line value, and having a match line, wherein the match line is asserted when the CAM line value corresponds to the first address, the CAM line comprising:

a first transistor of a first conductivity type having a gate coupled to receive a match enable signal, a first current electrode coupled to a first voltage reference terminal, and a second current electrode coupled to the match line;

a second transistor of a second conductivity type having a gate coupled to receive the match enable signal, a first current electrode coupled to a second voltage reference terminal, and a second current electrode forming a third voltage reference terminal;

a third transistor having a gate coupled to a match signal, a first current electrode coupled to the match line, and a second current electrode coupled to the third voltage reference terminal.

24. The translation circuit of claim 23 wherein the match line is precharged to a potential of the second voltage reference terminal and the third voltage reference terminal floats when the match enable signal is asserted, wherein when the match enable signal and match signal are asserted substantially at the same time, current is substantially prohibited from discharging current to the third voltage reference terminal.

25. The translation circuit of claim 23 further comprising:

a memory block for storing the corresponding second address;

a timing circuitry coupled to memory block for providing a memory enable signal only after the match line is asserted, wherein the memory block precharges only when an asserted enable signal is received.

26. The CAM line of claim 23 having a logic gate for providing the match enable signal, the logic gate having a first input coupled to receive a CAM enable signal, and a second input coupled to receive a CAM line valid signal for indicating when the CAM line value is valid, wherein the logic gate provides a valid match enable signal when the CAM enable signal is asserted and the CAM line value is asserted.

27. The CAM line of claim 23 further comprising:

a memory cell for storing a CAM address bit;

a bit line coupled to the memory cell, and a word line coupled to the memory cell for storing a bit value in the memory cell;

a comparator coupled to the memory cell, and the bit line, and for asserting the match signal if the bit value matches a value on the bit line.

28. The translation circuit of claim 23 wherein the match line is precharged to a potential of the second voltage reference terminal and the third voltage reference terminal floats when the match enable signal is asserted, wherein the comparator and the match enable signal operate substantially simultaneously.

* * * * *